United States Patent
Lunt et al.

(10) Patent No.: US 10,872,993 B2
(45) Date of Patent: Dec. 22, 2020

(54) VISIBLY TRANSPARENT, LUMINESCENT SOLAR CONCENTRATOR

(71) Applicant: MASSACHUSETTS INSTITUTE OF TECHNOLOGY, Cambridge, MA (US)

(72) Inventors: Richard Royal Lunt, Okemos, MI (US); Vladimir Bulovic, Lexington, MA (US); Miles Clark Barr, Redwood City, CA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 50 days.

(21) Appl. No.: 15/967,165

(22) Filed: Apr. 30, 2018

(65) Prior Publication Data

US 2018/0248064 A1 Aug. 30, 2018

Related U.S. Application Data

(63) Continuation of application No. 13/495,379, filed on Jun. 13, 2012, now Pat. No. 9,985,158.

(51) Int. Cl.
*H01L 31/055* (2014.01)

(52) U.S. Cl.
CPC ............ *H01L 31/055* (2013.01); *Y02E 10/52* (2013.01)

(58) Field of Classification Search
None
See application file for complete search history.

(56) References Cited

U.S. PATENT DOCUMENTS

| | | | |
|---|---|---|---|
| 3,509,712 A | 5/1970 | Grohoski | |
| 3,764,574 A | 10/1973 | Chiesa et al. | |
| 4,819,039 A | 4/1989 | Chi et al. | |
| 6,670,207 B1 | 12/2003 | Roberts et al. | |
| 2003/0077846 A1 | 4/2003 | Zucchelli et al. | |
| 2006/0260605 A1 | 11/2006 | Connor et al. | |
| 2007/0137696 A1* | 6/2007 | Krokoszinski | H01L 31/055 136/255 |
| 2007/0151595 A1 | 7/2007 | Chiou et al. | |
| 2009/0047487 A1* | 2/2009 | Klem, Jr. | A01M 29/06 428/210 |

(Continued)

OTHER PUBLICATIONS

Terpetschnig et al. (ISS technical note: "Long-wavelength polarization standards" 2008) (Year: 2008).*

(Continued)

*Primary Examiner* — Magali P Slawski
(74) *Attorney, Agent, or Firm* — Kilpatrick Townsend & Stockton LLP

(57) ABSTRACT

A visibly transparent luminescent solar concentrator (LSC) is disclosed. The LSC includes a transparent substrate having at least one edge surface. A dye layer is coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate. A photovoltaic device is coupled to the edge surface of the transparent substrate, the photovoltaic device being configured to absorb light at the peak emission wavelength and generate electrical energy.

14 Claims, 11 Drawing Sheets

(56) References Cited

U.S. PATENT DOCUMENTS

| | | | |
|---|---|---|---|
| 2009/0068113 A1* | 3/2009 | Danaboyina | A61K 47/6951 |
| | | | 424/9.6 |
| 2009/0205701 A1 | 8/2009 | Govaerts et al. | |
| 2009/0229652 A1 | 9/2009 | Mapel et al. | |
| 2009/0229664 A1 | 9/2009 | Appadurai et al. | |
| 2009/0302237 A1 | 12/2009 | Bortz et al. | |
| 2010/0193011 A1* | 8/2010 | Mapel | C03C 3/21 |
| | | | 136/246 |
| 2011/0010911 A1 | 1/2011 | Baldo et al. | |
| 2011/0253197 A1 | 10/2011 | Mapel et al. | |
| 2011/0301301 A1 | 12/2011 | Proto et al. | |
| 2013/0333755 A1 | 12/2013 | Lunt et al. | |
| 2014/0283896 A1* | 9/2014 | Lunt, III | H01L 31/055 |
| | | | 136/247 |
| 2015/0162462 A1 | 6/2015 | Berini et al. | |

OTHER PUBLICATIONS

Transparent, adj. (and n.). Oxford English Dictionary, OED Online. Oxford University Press, Sep. 2015, 4 pages.

Luminophore, Newnes Dictionary of Electronics, Newnes Dictionary of Electronics, 1999, 2 pages.

Luminophore, n, Oxford English Dictionary, OED Online. Oxford University Press, Mar. 2016, 2 pages.

Soda Lime Optical Glass Flats from VPG, http://www.vpglass.com/optical_glass/sodalime_glass.html VPG, Dec. 26, 2016, 2 pages.

U.S. Appl. No. 13/495,379, "Final Office Action", dated Sep. 7, 2016, 18 pages.

U.S. Appl. No. 13/495,379, "Non-Final Office Action", dated Jan. 4, 2017, 17 pages.

U.S. Appl. No. 13/495,379, "Non-Final Office Action", dated Sep. 21, 2017.

U.S. Appl. No. 13/495,379, "Notice of Allowance", dated Jan. 31, 2018, 8 pages.

Batchelder, et al., "Luminescent solar concentrators. 2: Experimental and theoretical analysis of their possible efficiencies", Applied Optics vol. 20, No. 21, Nov. 1981, pp. 3733-3754.

Bomm, et al., "Fabrication and full characterization of state-of-the-art quantum dot luminescent solar concentrators", Solar Energy Materials and Solar Cells vol. 95, No. 8, Aug. 2011, pp. 2087-2094.

Currie, et al., "High-Efficiency Organic Solar Concentrators for Photovoltaics", Science, vol. 321, No. 5886, Jul. 2008, pp. 226-228.

Debije, et al., "Thirty Years of Luminescent Solar Concentrator Research: Solar Energy for the Built Environment", Advanced Energy Materials, vol. 2 No. 1, Dec. 2011, pp. 12-35.

Giebink, et al., "Resonance-shifting to circumvent reabsorption loss in luminescent solar concentrators", Nature Photonics, 2011, 8 pages.

Goldschmidt, et al., "Increasing the efficiency of fluorescent concentrator systems", Solar Energy Materials and Solar Cells vol. 93, No. 2, Feb. 2009, pp. 176-182.

Guillaud, et al., "Metallophthalocyanines: Gas sensors, resistors and field effect transistors", Coordination Chemistry Reviews vols. 178-180, Part 2, 1998, pp. 1433-1484.

Hydahl, et al., "Photo-stability and perfonnance of CdSe/ZnS quantum dots in luminescent solar concentrators", Solar Energy, vol. 83, No. 4, Apr. 2009, pp. 566-573.

Moudam, et al., "Europium complexes with high total photoluminescence quantum yields in solution and in PMMA", Chem. Comm., 2009, pp. 6649-6651.

Mulder, et al., "Dye alignment in luminescent solar concentrators: I. Vertical alignment for improved waveguide coupling", Optical Society of America, vol. 18, Apr. 2010, pp. A79-A90.

Mulder, et al., "Dye alignment in luminescent solar concentrators: II. Vertical alignment for improved waveguide coupling", Optical Society of America, vol. 18, Apr. 2010, 9 pages.

Reisfeld, et al., "Planar solar energy converter and concentrator based on uranyl-doped glass", Nature vol. 274, Jul. 1978, pp. 144-145.

Shcherbatyuk, et al., "Viability of using near infrared PbS quantum dots as active materials in luminescent solar concentrators", Applied Physics Letters, vol. 96, 2010, pp. 191901-1-191901-3.

Slooff, et al., "A luminescent solar concentrator with 7.1% power conversion efficiency", Phys. Stat. Sol., vol. 2, No. 6, 2008, pp. 257-259.

Torres, "Modulating the Electronic Properties of Porphyrinoids", http://www.phthalocyanines.es/research-lines/phthalocyaninesfor-photovoltaic-cells/, 2015, 6 pages.

Wang, et al., "Europium complex doped luminescent solar concentrators with extended absorption range from UV to visible region", Solar Energy, 85, 2011, pp. 2179-2184.

Wang, et al., "Luminescent solar concentrator employing rare earth complex with zero self-absorption loss", Solar Energy vol. 85, No. 11, Nov. 2011, pp. 2571-2579.

* cited by examiner

Thin Film Abs. / PL

VISIBLY TRANSPARENT, LUMINESCENT SOLAR CONCENTRATOR

CROSS-REFERENCES TO RELATED APPLICATIONS

This application is a continuation of U.S. application Ser. No. 13/495,379, filed Jun. 13, 2012, the disclosure of which is hereby incorporated by reference in its entirety for all purposes.

FIELD OF INVENTION

This invention relates to the field of photovoltaic devices and more particularly, organic photovoltaic devices.

BACKGROUND

Manipulation of excitons in organic and molecular semiconductors provides opportunities for unique solar harvesting applications. For example, the presence of strongly-bound excitons leads to large optical resonances, generating structured absorption that can be utilized to produce highly transparent and efficient near-infrared emitting dyes suitable for low-cost luminescent solar concentrators (LSC). The obstacle of large-area solar cell deployment could be overcome, in part, with development of such a transparent photovoltaic system where incorporation of the LSC as window panes enhances the functionality of already utilized transparent surfaces without requiring the acquisition of undeveloped real estate and can significantly reduce balance-of-systems and PV installation costs.

BRIEF SUMMARY OF THE INVENTION

A visibly transparent luminescent solar concentrator (LSC) is disclosed. The LSC includes a transparent substrate having at least one edge surface. A dye layer is coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate. A photovoltaic device is coupled to the edge surface of the transparent substrate, the photovoltaic device being configured to absorb light at the peak emission wavelength and generate electrical energy.

The peak emission wavelength may be selected to optimize internal reflections within the transparent substrate. The transparent substrate may have an index of refraction that is selected to optimize internal reflections within the transparent substrate. The dye layer may have a peak absorption wavelength in at least one of the ultraviolet (UV) and near-infrared (NIR) bands. The dye layer may have a peak absorption of up to 20% of light in the visible band. The dye layer may have a peak absorption of up to 50% of light in the visible band.

The dye layer may include at least one of a molecular dye, an organometallic complex, and a rare earth phosphor. The dye layer may include at least one component selected from the group of a phthalocyanine, a porphyrin, rhodamine, an organic laser dye, perylene and its derivatives, a cyanine, a coumarin, a dioxazine, a naphthalimide, a thiazine and a stilbene. The dye layer may include at least one of U3, SnPc and carbon nanotubes.

The LSC may also include an index matching compound disposed between the edge of the substrate and the photovoltaic device. The photovoltaic device may include at least one of cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, inorganic nanocrystals and organic semiconductors.

The LSC of claim 1 may further include a wavelength selective mirror coupled to the substrate, the wavelength selective mirror being configured to reflect light at the peak emission wavelength. The wavelength selective mirror may be configured to transmit incident light in the visible band and the peak absorption wavelength. The LSC may include a first wavelength selective mirror disposed on a first surface of the substrate and a second wavelength selective mirror disposed on a second surface of the substrate, the first wavelength selective mirror being transparent in the visible band and at the peak absorption wavelength and reflective at the peak emission wavelength, the second wavelength selective mirror being transparent in the visible band and reflective at the peak emission wavelength and at the peak absorption wavelength.

A method of forming a visibly transparent luminescent solar concentrator (LSC) is also disclosed. The method includes providing a transparent substrate having at least one edge surface. A dye layer is formed and coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate. A photovoltaic device is coupled to the edge surface of the transparent substrate, the photovoltaic device being configured to absorb light at the peak emission wavelength and generate electrical energy.

The peak emission wavelength may be selected to optimize internal reflections within the transparent substrate. The transparent substrate may have an index of refraction selected to optimize internal reflections within the transparent substrate. The dye layer may have a peak absorption wavelength in at least one of the ultraviolet (UV) and near-infrared (NIR) bands. The dye layer may have a peak absorption of up to 20% of light in the visible band. The dye layer may have a peak absorption of up to 50% of light in the visible band.

The dye layer may include at least one of a molecular dye, an organometallic complex, and a rare earth phosphor. The dye layer may include at least one component selected from the group of a phthalocyanine, a porphyrin, rhodamine, an organic laser dye, perylene and its derivatives, a cyanine, a coumarin, a dioxazine, a naphthalimide, a thiazine and a stilbene. The dye layer may include at least one of U3, SnPc and carbon nanotubes. The LSC may also include a second dye layer with a peak absorption in at least one of the ultraviolet (UV) and near-infrared (NIR) bands and up to 20% of light in the visible band. In another embodiment, the LSC may include a second dye layer with a peak absorption in at least one of the ultraviolet (UV) and near-infrared (NIR) bands and up to 50% of light in the visible band.

An index matching compound may be disposed between the edge of the substrate and the photovoltaic device. A wavelength selective mirror may be disposed on the substrate, the wavelength selective mirror being configured to reflect light at the peak emission wavelength. The wavelength selective mirror may be configured to transmit incident light in the visible band and the peak absorption wavelength. A first wavelength selective mirror may be disposed on a first surface of the substrate and a second wavelength selective mirror may be disposed on a second surface of the substrate, the first wavelength selective mirror being transparent in the visible band and at the peak absorption wavelength and reflective at the peak emission wavelength, the second wavelength selective mirror being transparent in the visible band and reflective at the peak emission wavelength and at the peak absorption wavelength.

The photovoltaic device may include at least one of cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, inorganic nanocrystals and organic semiconductors.

A method of generating electricity is also disclosed. The method includes providing a luminescent solar concentrator (LSC) having a transparent substrate having at least one edge surface. A dye layer is coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate; and a photovoltaic device coupled to the edge surface of the transparent substrate, the photovoltaic device being configured to absorb light at the peak emission wavelength and generate electrical energy. The LSC is exposed to light.

DETAILED DESCRIPTION OF THE INVENTION

Disclosed herein is a transparent luminescent solar cell configuration. The cell includes either neat or doped molecular luminescent layers with absorption and emission features only in the ultra-violet (UV) and near-infrared (NIR) solar spectrum (absorption and emission peaks outside the visible spectrum), disposed in/on a transparent matrix or substrate. These molecules remit solar radiation outside of the visible band e.g., at longer wavelengths into waveguided modes of the host substrate. This waveguided light is captured at the edge of the LSC and converted to electricity via any suitable solar cell, such as Si, GaAs, InGaAs, etc. Given high NIR photoluminescence quantum yields, limiting efficiencies for transparent solar architectures may be more rapidly and cheaply realized.

The term "transparent" as used herein encompasses average transmission of a straight through beam of 45% or more across the visible band. The term "near-infrared" (NIR) and "near-infrared band" as recited herein is defined as light having wavelengths in the range from the upper edge of the visible band (about 650 nm) to about 2-3 um. The term "ultraviolet" (UV) and "ultraviolet band" as recited herein is defined as light having wavelengths from the lower edge of the visible band (about 450 nm) and less. The term "visible light" and "visible band" as recited herein is defined as light having wavelengths to which the human eye has a significant response, from about 435 nm to about 670 nm.

Figure 1A:
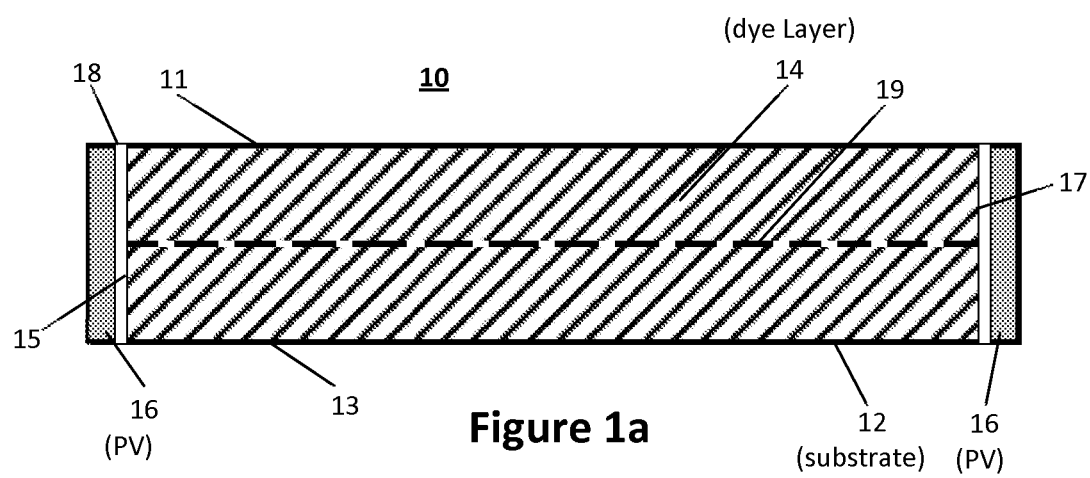
FIG. 1a is a side sectional view of a transparent, near infra-red (NIR)/ultraviolet (UV) absorbing luminescent solar concentrator (LSC) with a dye layer distributed throughout the thickness of the substrate.
Figure 1B:
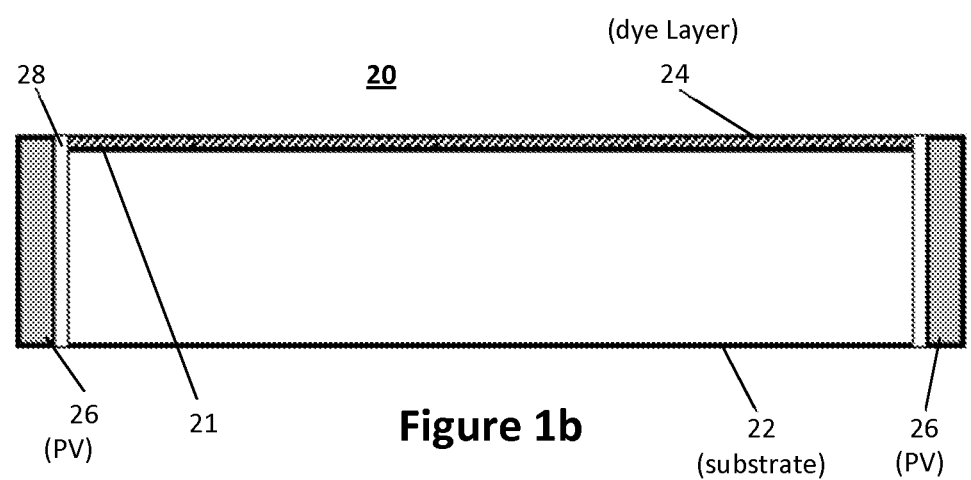
FIG. 1b is a side sectional view of LSC with a dye layer disposed on the top surface of the substrate.

FIG. 1a is side sectional view of a transparent luminescent solar concentrator (LSC) 10. The LSC 10 includes a transparent matrix or substrate 12. The substrate is generally transparent to visible light may be constructed from a variety of materials such as glass or a variety of plastics including thermoplastic polymers such as acrylics, polycarbonates and the like. The substrate 10 generally includes an upper and lower surface 11, 13. The substrate 10 also includes at least one side surface. Assuming the substrate has a generally rectangular geometry, e.g., as shown in FIG. 1d, the substrate 10 will include 4 side surfaces. In this example, only the left and right side surfaces 15, 17 are shown. The LSC 10 also includes a UV/NIR absorbing luminescent dye (dye) layer 14. It should be understood that dye layer 14 may include one or more individual layers formed of one or more dyes as shown generally by dashed line 19. In general the dye layer 14 is configured to absorb UV/NIR light at a peak absorption wavelength and re-emit light a peak emission wavelength.

The LSC also includes at least one photovoltaic device (PV) 16 configured to absorb the light emitted at the peak emission wavelength. Suitable PV devices may be selected from a variety of devices as disclosed above including Si PV devices (typically lower cost and lower efficiency) and GaAs and InGaAs PV devices (typically higher cost and higher efficiency). In general the photovoltaic device may include at least one of the following: cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, inorganic nanocrystals and organic semiconductors.

The LSC 10 may also include an index matching layer 18 configured to reduce reflection losses associated with the interface between the substrate 12 and the PV 16. It should be understood that the dye layer 24 may be applied to one or more surfaces of the substrate or may be distributed throughout the thickness of the substrate. For example, FIG. 1b is a side sectional view of a LSC 20 with a dye layer 24 deposited on the upper surface 21 of the substrate 22. The LSC 20 also includes at least one PV device 26 configured to absorb the light emitted at the second wavelength as disclosed above. The LSC 20 may also include an index matching layer 28 configured to reduce reflection losses associated with the interface between the substrate 22 and the PV 16 as disclosed above.

Figure 1C:
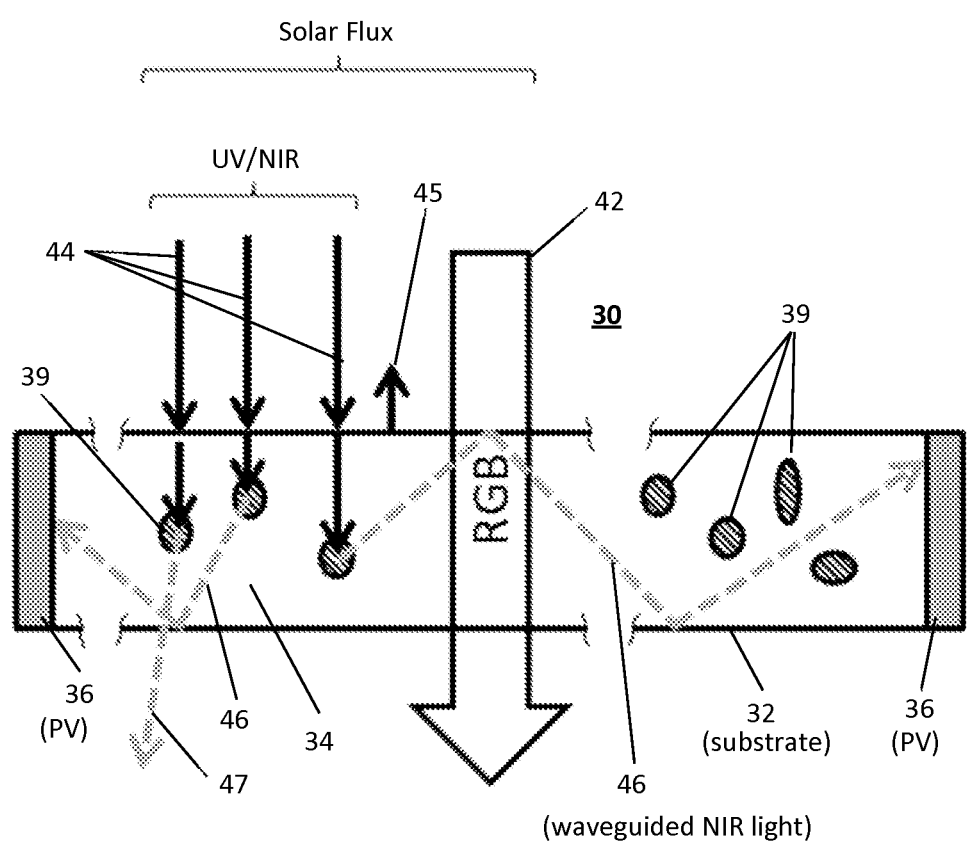
FIG. 1c is a highly magnified side sectional view of an LSC with a dye layer distributed throughout the thickness of the substrate.
Figure 1D:
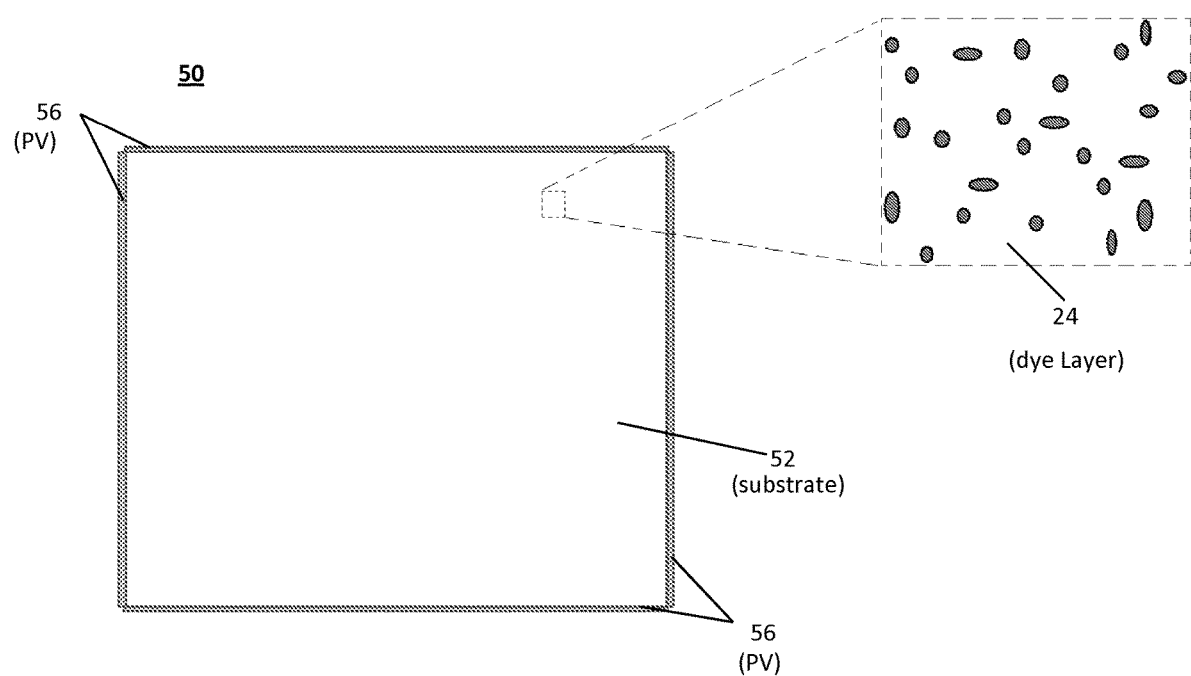
FIG. 1d is a top view of a rectangular LSC with PV devices disposed on all four edges of the substrate.

FIG. 1c is a highly magnified side sectional view of an LSC 30 with a dye layer 34 distributed throughout the thickness of the substrate 32. The LSC includes PV devices 36 disposed at the edges of the substrate as disclosed above. It should be understood that an index matching layer (not shown) may be used to reduce reflection losses associated with the interface between the substrate 32 and the PV devices 36 as disclosed above. The dye layer 34 comprises a plurality of individual dye molecules shown generally by reference number 39. The substrate 32 is generally transparent to visible light as shown by arrow 42. When exposed to sun light, full spectrum light enters the substrate as shown by arrows 44 and hits dye molecules 39. The dye molecules 39 generally have a peak absorption wavelength outside the visible band (UV/NIR). The dye molecules are configured to re-emit light at a peak emission wavelength that is also outside the visible band, e.g., in the NIR band. The peak emission wavelength is typically selected so that the emitted light is internally reflected (waveguided to the edges) of the substrate 32. It should be understood that selection of the peak emission wavelength will depend upon the optical properties of the substrate material. It should also be understood that a portion of the light striking the LSC 30 is reflected as shown by arrow 45. Similarly, a portion of the light emitted by the dye will not be internally reflected as shown by arrow 47.

FIG. 1d is a top view of a rectangular LSC 50 with a dye layer 34 deposited on the surface of the transparent substrate 52. The LSC 50 includes PV devices 56 disposed on all four edges of the substrate. As discussed above, an index matching layer (not shown) may be used to reduce reflection losses associated with the interface between the substrate 32 and the PV 36.

Figure 2A:
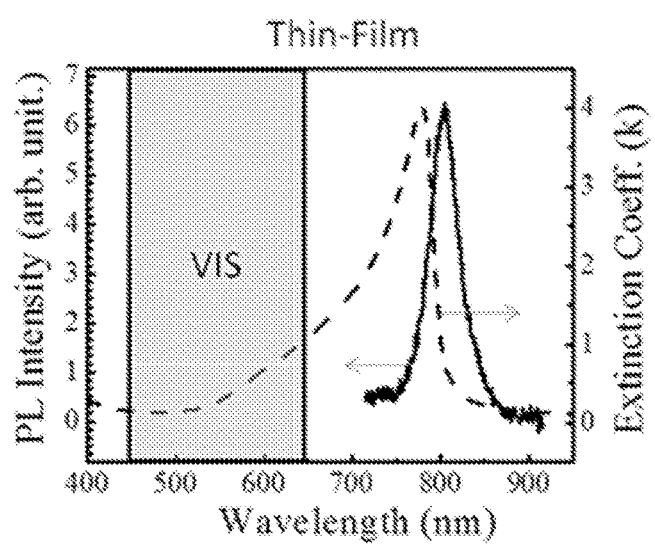
FIG. 2a is a graph showing the performance of a suitable U3 dye.
Figure 2A:
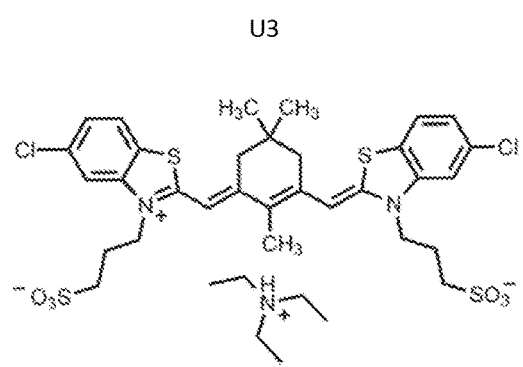
Figure 2B:
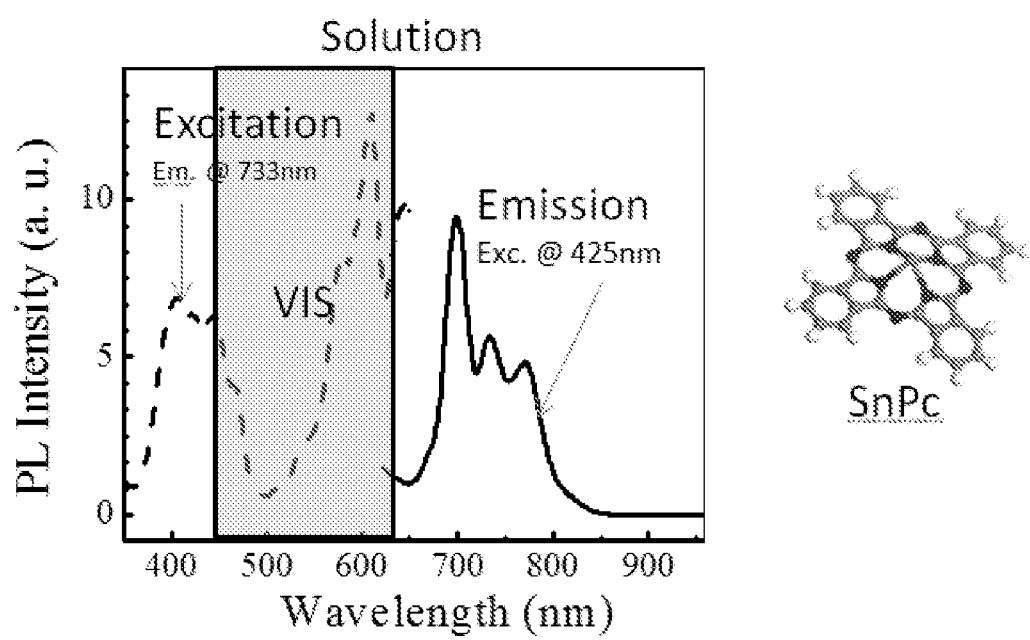
FIG. 2b is a graph showing the performance of a suitable SnPc dye.

It should also be understood that a portion of the light striking the LSC may be absorbed by the dye layer. Section of appropriate dye materials is an important consideration. Several dye materials may be used with the LSCs disclosed herein. For example, FIG. 2a is a graph showing the performance of a suitable U3 dye with peak absorption and emission wavelengths in the NIR band. U3 has a peak absorption wavelength (dashed line) at about 775 nm and a peak emission wavelength at about 800 nm (solid line). FIG. 2b is a graph showing the performance of a suitable SnPc dye. SnPc has an absorption peak in the UV band, an absorption peak in the visible band and NIR bands (dashed line). SnPc also has a peak emission in the NIR band as shown.

Figure 2C:
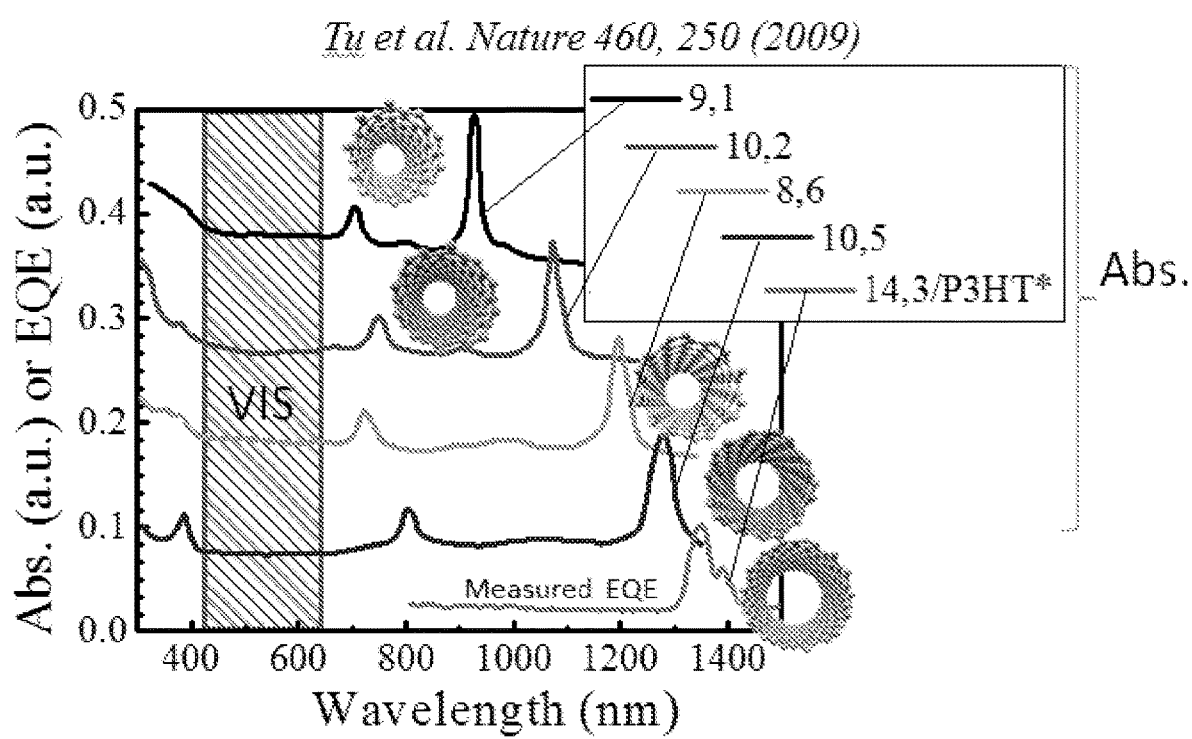
FIG. 2c is a graph showing the performance of several types of suitable carbon nanotubes that may be used in a dye.
Figure 2D:
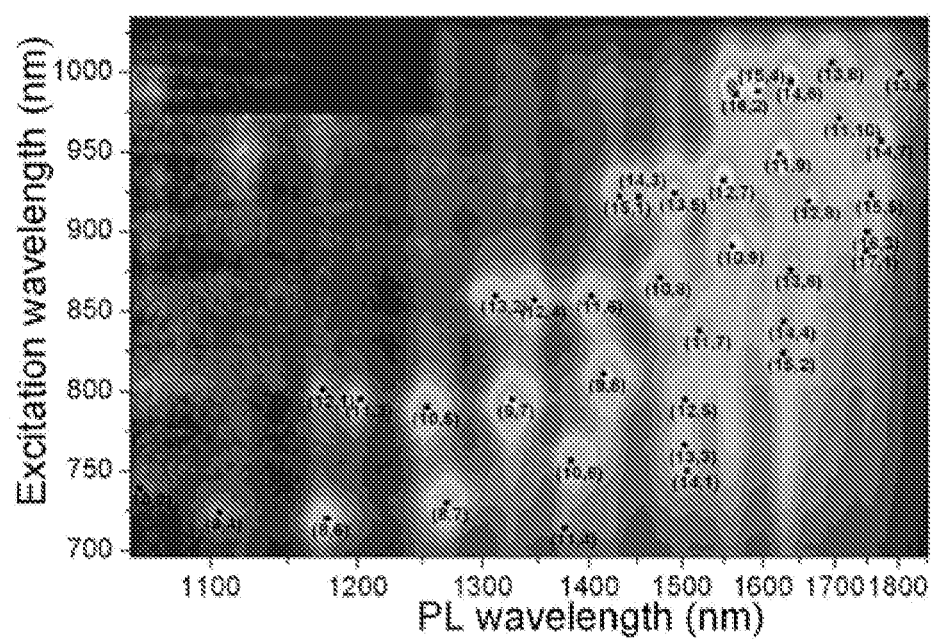
FIG. 2d is a photoluminescence map from suitable single-wall carbon nanotubes.

FIG. 2c is a graph showing the peak absorption wavelength of several types of suitable carbon nanotubes that may be used in a dye. FIG. 2d is a photoluminescence map from suitable single-wall carbon nanotubes. All of these carbon nanotubes have peak absorption wavelengths outside of the visible band. The lower curve shows the quantum efficiency of an actual photovoltaic device using 14,3 carbon nanotubes. FIG. 2d is a graph showing the peak emission wavelengths of several types of carbon nanotubes. All of these carbon nanotubes have emission peaks outside of the visible band.

The luminescent solar concentrators disclosed herein may be made using a variety of different dyes such as, for example the illustrative dyes described above. Other suitable dyes include but are not limited to: rare earth phosphors, organometallic complexes, porphyrins, perlyene and its derivatives, organic laser dyes, FL-612 from Luminophor JSC, substituted pyrans (such as dicyanomethylene, coumarins (such as Coumarin 30), rhodamines (such as Rhodamine B), oxazine, Exciton LDS series dyes, Nile Blue, Nile Red, DODCI, Epolight 5548, BASF Lumogen dyes (for instance: 083, 170, 240, 285, 305, 570, 650, 765, 788, and 850), other substituted dyes of this type, other oligorylenes, and dyes such as DTTC1, Steryl 6, Steryl 7, prradines, indocyanine green, styryls (Lambdachrome series), dioxazines, naphthalimides, thiazines, stilbenes, IR132, IR144, IR140, Dayglo Sky Blue (D-286) Columbia Blue (D-298), and organometallic complexes of rare earth metals (such as europium, neodymium, and uranium).

Figure 3:
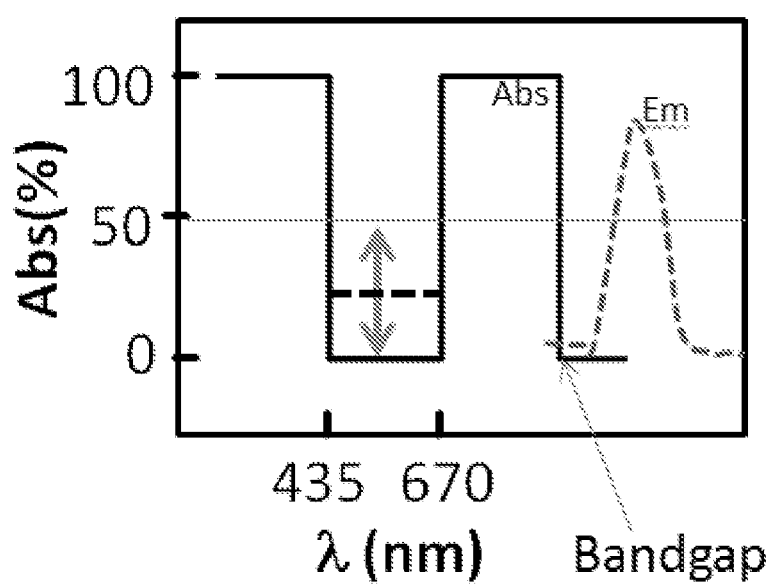
FIG. 3 shows a graph of idealized absorption and emission spectra.

It should be understood that several of the disclosed dyes may be combined in one or more dye layers to optimize the bandwidth of the absorption band. FIG. 3 shows a graph idealized absorption and emission spectrums. In general, the absorption peak(s) may be located anywhere outside the visible band. The different dye layers may be combined to optimize the spectral coverage of the LSC. Dye layers may be selected such that bandgap between absorption and emission peaks have minimal overlap. In general, it is desirable to provide some separation between the dye absorption peaks and the emission peaks so that emitted light is not re-absorbed. This typically reduces re-absorption losses. The dyes may be applied via a variety of methods. For example, a dye layer may be applied by a thin film deposition process to the surface of the transparent substrate. A dye layer may also be combined with the substrate materials and distributed throughout the thickness of the substrate. Using the disclosed dyes, an LSC may be constructed with up to 20% light absorption in the visible band. Less preferably, an LSC may be constructed with up to 50% light absorption in the visible band.

As discussed above, the substrate is generally transparent to visible light may be constructed from a variety of materials including but not limited to polymethylmethacrylate (PMMA), glass, lead-doped glass, lead-doped plastics, aluminum oxide, polycarbonate, polyamide, polyester, polysiloxan, polyester resins, epoxy resins, ethyl cellulose, polyethylene terephthalate, polyethylenimine, polypropylene, poly vinyl chloride, soda lime glass, borosilicate glasses, acrylic glass, aluminum oxynitride, fused silica, halide-chalcogenide glasses, titania-doped glass, titania-doped plastics, zirconia-dopes glass, zirconia-dopes plastics alkaline metal oxide-doped glass, barium-doped plastics, and zinc oxide-doped glass, and zinc oxide-dopes plastics.

The substrate may be formed of high refractive index material. The term "high refractive index" refers to a material having a refractive index of at least 1.7. By increasing the refractive index of the substrate, the light trapping efficiency of the solar concentrator may be increased. Illustrative high refractive index materials suitable for use in solar concentrators disclosed herein include, but are not limited to, high index glasses such as lead-doped glass, aluminum oxide, halidechalcogenide glasses, titania-doped glass, zirconia-doped glass, alkaline metal oxide-doped glass, barium oxide-doped glass, zinc oxide-doped glass, and other materials such as, for example, lead-doped plastics, barium-doped plastics, alkaline metal oxide-doped plastics, titania-doped plastics, zirconia-doped plastics, and zinc oxide-doped plastics."

The substrate may have an index of refraction that is chosen to optimize internal reflections within the transparent substrate. Selection of index of refraction generally involves balancing front side reflection losses (at 90°) with increased internal reflection efficiency. For example, a substrate with an index of refraction of 1.5 will generally have 4% front side reflection (at 90°) and 75% internal reflection. A substrate having an index of refraction of 2.2 will have 14% reflection at 90° and 89% internal reflection.

The LSC may further include one or more wavelength selective mirrors coupled to the substrate. The wavelength selective mirrors may be generally configured to reflect light at the peak emission wavelength to improve the efficiency of the LSC.

Figure 4A:
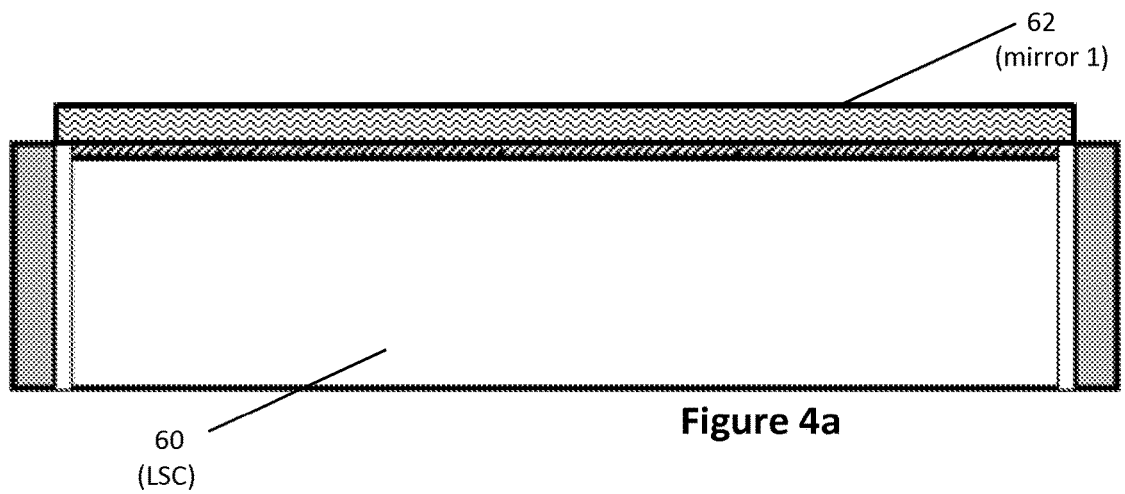
FIG. 4a is a block diagram showing an LSC with a wavelength selective mirror coupled to the top surface of the substrate.
Figure 5A:
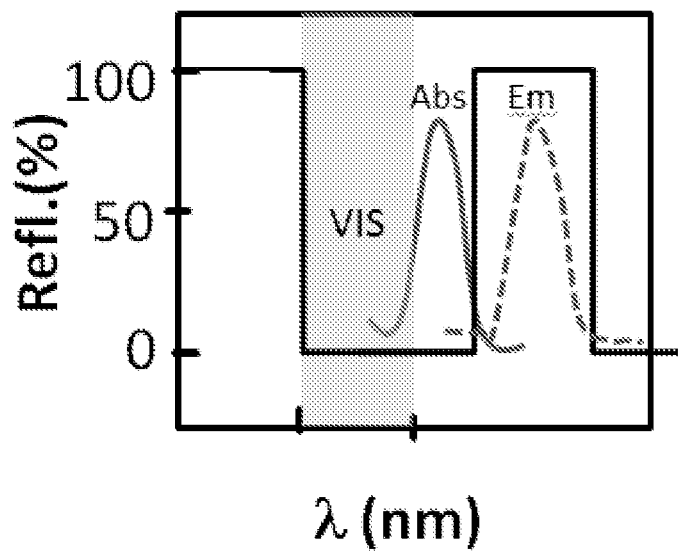
FIG. 5a is a graph showing the ideal mirror reflectivity for a first reflective mirror.

FIG. 4a is a block diagram showing an LSC 60 with a single wavelength selective mirror 62 coupled to the top surface of the substrate. The wavelength selective mirror 62 may be configured to transmit incident light in the visible band and at the peak absorption wavelength. The wavelength selective mirror 62 may be configured to reflect light at the peak emission wavelength. FIG. 5a is a graph showing the ideal mirror reflectivity for such a wavelength selective mirror.

Figure 4B:
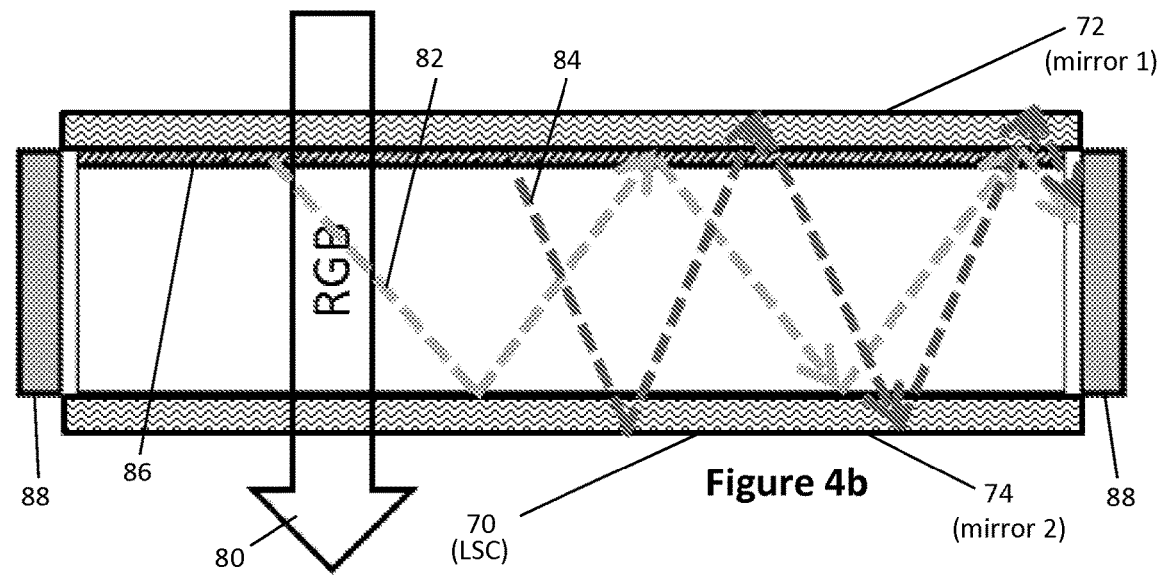
FIG. 4b is a block diagram showing an LSC with wavelength selective mirrors coupled to the top and bottom surfaces of the substrate.

FIG. 4b is a block diagram showing an LSC 70 with wavelength selective mirrors 72, 74 coupled to the top and bottom surfaces of the substrate. In this example, both wavelength selective mirrors 72, 74 are configured to transmit incident light in the visible band and at the peak absorption wavelength and reflect light at the peak emission wavelength as shown in FIG. 5a. In operation, as light enters the LSC (see arrow 80), the dye layer emits light at the peak emission wavelength. A portion of the light at the peak emission wavelength is waveguided by the substrate as discussed above (see arrow 82). A portion of the light at the peak emission wavelength is not waveguided due to typical losses. Some of this light is reflected by the wavelength selective mirror(s) and may be directed to the PVs 88 as shown by arrow 84.

Figure 4C:
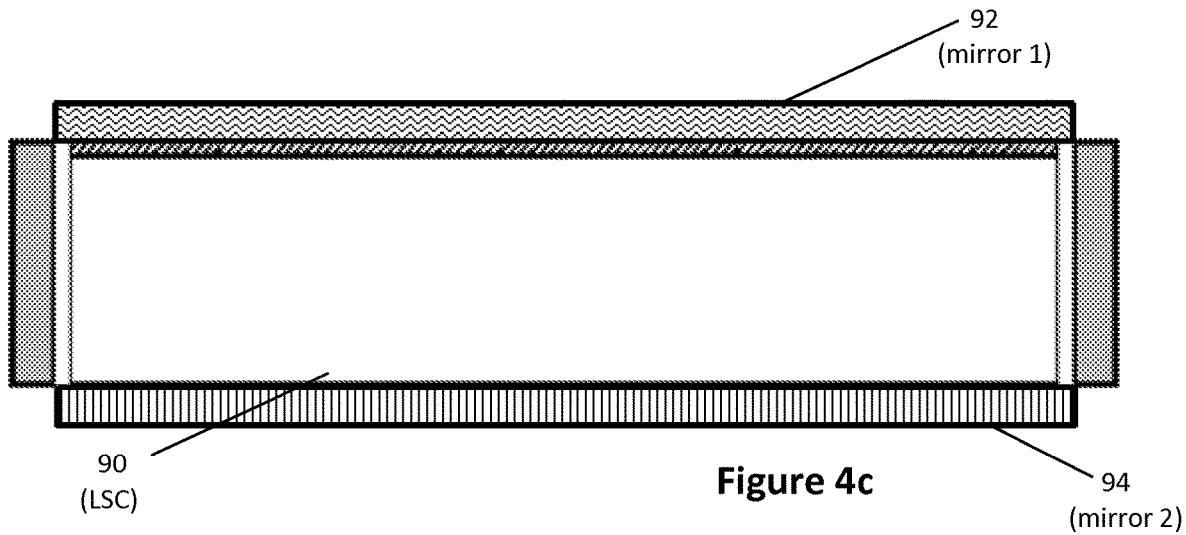
FIG. 4c is a block diagram showing an LSC with wavelength selective mirrors coupled to the top and bottom surfaces of the substrate.
Figure 5B:
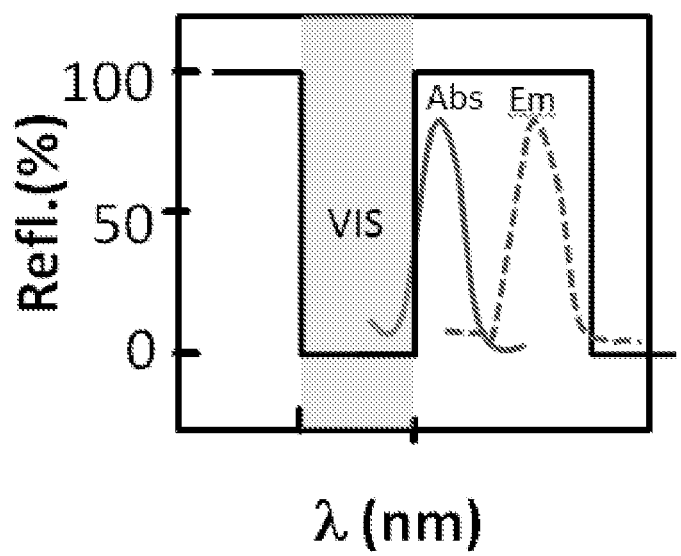
FIG. 5b is a graph showing the ideal mirror reflectivity for a second reflective mirror.

FIG. 4c is a block diagram showing an LSC 90 with wavelength selective mirrors 92, 94 coupled to the top and bottom surfaces of the substrate. The first wavelength selective mirror 92 is configured to transmit incident light in the visible band and the peak absorption wavelength and reflect light at the peak emission wavelength as shown in FIG. 5a. The second wavelength selective mirror 94 is configured to transmit incident light in the visible band and reflect light at the peak absorption wavelength and the peak emission wavelength. FIG. 5b is a graph showing the ideal mirror reflectivity for such a second wavelength selective mirror.

Figure 6:
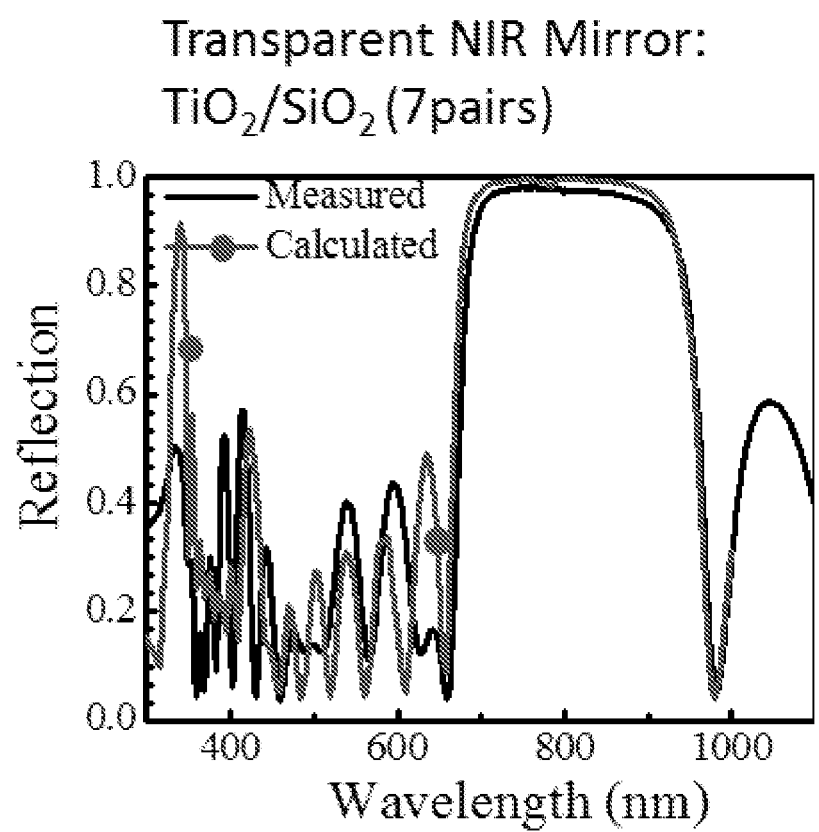
FIG. 6 is a graph showing the performance characteristics of an example NIR mirror.

Suitable wavelength selective mirrors may be fabricated using a variety of materials and processes. For example, a wavelength selective mirror may be fabricated by sputtering or otherwise depositing one or more dielectric layers onto the substrate such as alternating layers of $SiO_2$ and $TiO_2$. FIG. 6 is a graph showing the performance characteristics of an example NIR mirror suitable that is reflective in the 650 nm-980 nm range.

It should be understood that many variations are possible based on the disclosure herein. Although features and elements are described above in particular combinations, each feature or element can be used alone without the other features and elements or in various combinations with or without other features and elements.

What is claimed is:

1. A visibly transparent photovoltaic system, comprising:
    a visibly transparent substrate having a top surface, a bottom surface, and a plurality of side edges, wherein the visibly transparent substrate exhibits an average visible band transmission of 45% or more;
    a luminescent dye layer coupled to the visibly transparent substrate, wherein the luminescent dye layer exhibits:
        absorption at all wavelengths in a visible band of from 0% to 50%,
        a peak absorption wavelength in an ultraviolet band or a near-infrared band, and
        a peak photoluminescent emission wavelength in the near-infrared band;
    a photovoltaic device positioned at a side edge of the plurality of side edges to receive photoluminescent emission from the luminescent dye layer, wherein the photovoltaic device absorbs light in the near-infrared band for generation of electrical energy;
    a wavelength selective mirror coupled to the top surface, wherein the wavelength selective mirror reflects light at the peak photoluminescent emission wavelength, transmits light at the peak absorption wavelength, and transmits light in the visible band; and
    a second wavelength selective mirror coupled to the bottom surface, wherein the second wavelength selective mirror reflects light at the peak photoluminescent emission wavelength, transmits light at the peak absorption wavelength, and transmits light in the visible band.

2. The visibly transparent photovoltaic system of claim 1, wherein the luminescent dye layer is applied to the top surface or the bottom surface.

3. The visibly transparent photovoltaic system of claim 1, wherein the luminescent dye layer is distributed throughout a thickness of the visibly transparent substrate.

4. The visibly transparent photovoltaic system of claim 1, wherein the maximum absorption in the visible band of the luminescent dye layer is between 0% and 20%.

5. The visibly transparent photovoltaic system of claim 1, wherein the luminescent dye layer comprises:
    a first dye species exhibiting a first peak absorption wavelength in the ultraviolet band or the near-infrared band and a first peak photoluminescent emission wavelength in the near-infrared band; and
    a second dye species exhibiting a second peak absorption wavelength in the ultraviolet band or the near-infrared band and a second peak photoluminescent emission wavelength in the near-infrared band, wherein the first peak absorption wavelength and the second peak absorption wavelength are different, and wherein the first peak photoluminescent emission wavelength and the second peak photoluminescent emission wavelength are different.

6. The visibly transparent photovoltaic system of claim 5, wherein the first peak absorption wavelength and the second peak absorption wavelength are separated from the first peak photoluminescent emission wavelength and the second peak photoluminescent emission wavelength.

7. The visibly transparent photovoltaic system of claim 1, wherein the visibly transparent substrate functions as a waveguide to direct at least a portion of the photoluminescent emission generated by the luminescent dye layer to the photovoltaic device.

8. The visibly transparent photovoltaic system of claim 1, wherein the wavelength selective mirror reflects light in the ultraviolet band.

9. The visibly transparent photovoltaic system of claim 1, further comprising an index matching layer between the side edge and the photovoltaic device.

10. The visibly transparent photovoltaic system of claim 1, wherein the visibly transparent substrate comprises a high refractive index material.

11. A method of making a visibly transparent photovoltaic system, the method comprising:
providing a visibly transparent substrate having a top surface, a bottom surface, and a plurality of side edges, wherein the visibly transparent substrate exhibits an average visible band transmission of 45% or more;
coupling a luminescent dye layer to the visibly transparent substrate, wherein the luminescent dye layer exhibits:
absorption at all wavelengths in a visible band of from 0% to 50%,
a peak absorption wavelength in an ultraviolet band or a near-infrared band, and
a peak photoluminescent emission wavelength in the near infrared band;
coupling a photovoltaic device to a side edge of the plurality of side edges to position the photovoltaic device to receive photoluminescent emission from the luminescent dye layer, wherein the photovoltaic device absorbs light in the near-infrared band for generation of electrical energy;
coupling a wavelength selective mirror to the top surface, wherein the wavelength selective mirror reflects light at the peak photoluminescent emission wavelength, transmits light at the peak absorption wavelength, and transmits light in the visible band; and
comprising coupling a second wavelength selective mirror to the bottom surface, wherein the second wavelength selective mirror reflects light at the peak photoluminescent emission wavelength, transmits light at the peak absorption wavelength, and transmits light in the visible band.

12. The method of claim 11, wherein the luminescent dye layer comprises:
a first dye species exhibiting a first peak absorption wavelength in the ultraviolet band or the near-infrared band and a first peak photoluminescent emission wavelength in the near-infrared band; and
a second dye species exhibiting a second peak absorption wavelength in the ultraviolet band or the near-infrared band and a second peak photoluminescent emission wavelength in the near-infrared band, wherein the first peak absorption wavelength and the second peak absorption wavelength are different, and wherein the first peak photoluminescent emission wavelength and the second peak photoluminescent emission wavelength are different.

13. The method of claim 12, wherein the first peak absorption wavelength and the second peak absorption wavelength are separated from the first peak photoluminescent emission wavelength and the second peak photoluminescent emission wavelength.

14. A method of generating electricity, the method comprising:
providing a visibly transparent photovoltaic system, wherein the visibly transparent photovoltaic system includes:
a visibly transparent substrate having a top surface, a bottom surface, and a plurality of side edges, wherein the visibly transparent substrate exhibits an average visible band transmission of 45% or more;
a luminescent dye layer coupled to the visibly transparent substrate, wherein the luminescent dye layer exhibits:
absorption at all wavelengths in a visible band of from 0% to 50%,
a peak absorption wavelength in an ultraviolet band or a near-infrared band, and
a peak photoluminescent emission wavelength in the near-infrared band;
a photovoltaic device positioned at a side edge of the plurality of side edges to receive photoluminescent emission from the luminescent dye layer, wherein the photovoltaic device absorbs light in the near-infrared band for generation of electrical energy;
a wavelength selective mirror coupled to the top surface, wherein the wavelength selective mirror reflects light at the peak photoluminescent emission wavelength, transmits light at the peak absorption wavelength, and transmits light in the visible band; and
a second wavelength selective mirror coupled to the bottom surface, wherein the second wavelength selective mirror reflects light at the peak photoluminescent emission wavelength, transmits light at the peak absorption wavelength, and transmits light in the visible band; and
exposing the visibly transparent photovoltaic system to incident light having wavelengths in the visible band, wavelengths in the ultraviolet band, and wavelengths in the near-infrared band, wherein at least a portion of the incident light having wavelengths in the visible band are transmitted through the visibly transparent substrate and the luminescent dye layer, wherein the luminescent dye layer absorbs at least a portion of the incident light having wavelengths in the near-infrared band or wavelengths in the ultraviolet band, or both, and generates photoluminescent emission with the peak photoluminescent emission wavelength in the near-infrared band, and wherein at least a portion of the photoluminescent emission is absorbed by the photovoltaic device to generate electricity.

* * * * *

UNITED STATES PATENT AND TRADEMARK OFFICE
CERTIFICATE OF CORRECTION

| | |
|---|---|
| PATENT NO. | : 10,872,993 B2 |
| APPLICATION NO. | : 15/967165 |
| DATED | : December 22, 2020 |
| INVENTOR(S) | : Lunt et al. |

Page 1 of 1

It is certified that error appears in the above-identified patent and that said Letters Patent is hereby corrected as shown below:

In the Specification

In Column 1, Line 9, after paragraph "CROSS-REFERENCES TO RELATED APPLICATIONS" insert heading & paragraph:
--GOVERNMENT SUPPORT
This invention was made with government support under DE-SC0001088 awarded by the U.S. Department of Energy. The government has certain rights in the invention.--

Signed and Sealed this
Eleventh Day of November, 2025

John A. Squires
*Director of the United States Patent and Trademark Office*